US012203867B1

(12) United States Patent
Liu et al.

(10) Patent No.: US 12,203,867 B1
(45) Date of Patent: Jan. 21, 2025

(54) DARK-FIELD CONFOCAL MICROSCOPY MEASUREMENT APPARATUS AND METHOD BASED ON DIFFERENTIAL FRACTIONAL VORTEX BEAM

(71) Applicant: Harbin Institute of Technology, Harbin (CN)

(72) Inventors: Jian Liu, Harbin (CN); Chenguang Liu, Harbin (CN); Zijie Hua, Harbin (CN); Kang Gu, Harbin (CN)

(73) Assignee: Harbin Institute of Technology, Harbin (CN)

( * ) Notice: Subject to any disclaimer, the term of this patent is extended or adjusted under 35 U.S.C. 154(b) by 0 days.

(21) Appl. No.: 18/802,309

(22) Filed: Aug. 13, 2024

(51) Int. Cl.
*G01N 21/88* (2006.01)
*G01R 31/311* (2006.01)

(52) U.S. Cl.
CPC ....... *G01N 21/8806* (2013.01); *G01R 31/311* (2013.01); *G01N 2201/06113* (2013.01); *G01N 2201/0675* (2013.01); *G01N 2201/105* (2013.01)

(58) Field of Classification Search
CPC ..... G01N 21/8806; G01N 2201/06113; G01N 2201/0675; G01N 2201/105; G01R 31/311
See application file for complete search history.

(56) References Cited

U.S. PATENT DOCUMENTS

| 10,733,729 | B2* | 8/2020 | Alfano | G01N 21/21 |
| 11,002,677 | B2* | 5/2021 | Ashrafi | G01N 21/21 |
| 2016/0054225 | A1* | 2/2016 | Fay, Jr. | G02B 21/10 |
| | | | | 250/206 |
| 2016/0054552 | A1* | 2/2016 | Tani | G02B 21/0052 |
| | | | | 359/385 |

* cited by examiner

*Primary Examiner* — Hung V Nguyen
(74) *Attorney, Agent, or Firm* — Reising Ethington P.C.

(57) ABSTRACT

Provided are a dark-field confocal microscopy measurement apparatus and method. The apparatus includes: a fractional vortex beam module configured to generate first fractional vortex beam and second fractional vortex beam; an optical scanning module configured to scan a sample by using the first fractional vortex beam and the second fractional vortex beam to obtain first signal return light and second signal return light respectively; a dark-field detection module configured to perform dark-field detection on the first signal return light and the second signal return light to obtain a first fractional-order dark-field image and a second fractional-order dark-field image respectively; a differential dark-field scattered image determining module configured to differentiate the first fractional-order dark-field image from the second fractional-order dark-field image to obtain a differential dark-field scattered image; and a defect determining module configured to process the differential dark-field scattered image to obtain a sample defect.

20 Claims, 2 Drawing Sheets

DARK-FIELD CONFOCAL MICROSCOPY MEASUREMENT APPARATUS AND METHOD BASED ON DIFFERENTIAL FRACTIONAL VORTEX BEAM

CROSS-REFERENCE TO RELATED APPLICATIONS

This patent application claims the benefit and priority of Chinese Patent Application No. 2024110181806, filed with the China National Intellectual Property Administration on Jul. 26, 2024, the disclosure of which is incorporated by reference herein in its entirety as part of the present application.

TECHNICAL FIELD

The present disclosure relates to the technical field of optical precision measurement, and in particular, to a dark-field confocal microscopy measurement apparatus and method based on a differential fractional vortex beam.

BACKGROUND OF THE INVENTION

Interlayer defects (such as holes and layer faults) in three-dimensional (3D) integrated circuits often degrade the electrical performance and lifespan of the 3D integrated circuits. Detecting these interlayer defects is crucial for ensuring high product yield in semiconductor 3D integrated circuits. The confocal microscopy measurement technology is suitable for non-destructive defect detection in the 3D integrated circuits due to its 3D sectioning capability.

However, when detecting an interlayer defect, the conventional confocal microscopy measurement technology often results in an insufficient signal-to-noise ratio of interlayer defect detection and limited detection sensitivity because reflected light from a semiconductor surface easily overwhelms scattered light from the interlayer defect.

The dark-field confocal microscopy measurement technology has become essential for non-destructive 3D defect detection in semiconductors due to advantages such as an excellent optical sectioning capability, high imaging resolution, and strong imaging contrast against a dark background. The dark-field confocal microscopy measurement technology can effectively separate surface reflected light and interlayer scattered light. However, the conventional optical dark-field confocal microscopy measurement technology exhibits a low response rate to micro-scale defects, and can detect only defects with a scale greater than 50 nm, while smaller defects are easily submerged in background noise, resulting in a low defect detection rate.

Therefore, representing characteristics of the interlayer defects in the 3D integrated circuits more comprehensively and achieving high-sensitivity defect detection is a pressing concern for technicians in this field.

SUMMARY OF THE INVENTION

The purpose of the present disclosure is to provide a dark-field confocal microscopy measurement apparatus and method based on a differential fractional vortex beam, to improve an imaging signal-to-noise ratio and sensitivity of defect detection.

To achieve the above objective, the present disclosure provides the following technical solutions.

According to a first aspect, the present disclosure provides a dark-field confocal microscopy measurement apparatus based on a differential fractional vortex beam, including a fractional vortex beam module, an optical scanning module, a dark-field detection module, a differential dark-field scattered image determining module, and a defect determining module.

The fractional vortex beam module is configured to generate first fractional vortex beam and second fractional vortex beam, where the first fractional vortex beam is generated by superposing a first vortex phase and a phase of a blazed grating, and the second fractional vortex beam is generated by superposing a second vortex phase and the phase of the blazed grating.

The optical scanning module is configured to first transfer the first fractional vortex beam to a sample for scanning to obtain first signal return light, and then transfer the second fractional vortex beam to the sample for scanning to obtain second signal return light.

The dark-field detection module is configured to perform dark-field detection of both the returned signals with illumination of the first and the second fractional vortex beams, and obtain the first fractional-order and the second fractional-order dark-field images corresponding to the first and the second fractional vortex beam illumination.

The differential dark-field scattered image determining module is configured to differentiate the first fractional-order dark-field image from the second fractional-order dark-field image to obtain a differential dark-field scattered image.

The defect determining module is configured to process the differential dark-field scattered image to obtain a sample defect.

Optionally, the fractional vortex beam module includes a laser, a half-wave plate, a polarizer, a mirror, a first non-polarizing beam splitter, a spatial light modulator (SLM), and a beam expander.

The laser is configured to output laser light in a visible light band. The laser light in the visible light band sequentially passes through the half-wave plate, the polarizer, the mirror, the first non-polarizing beam splitter, and the SLM to obtain fractional vortex beam. The fractional vortex beam includes the first fractional vortex beam and the second fractional vortex beam. The fractional vortex beam is expanded by the beam expander to obtain beam-expanded fractional vortex beam, and the beam-expanded fractional vortex beam is transferred to the optical scanning module.

Optionally, a loaded phase distribution of the SLM is the superposition of a vortex phase and the phase of the blazed grating.

Optionally, the optical scanning module includes a second non-polarizing beam splitter, a scanning galvanometer, a scanning lens, a tube lens, and an objective lens.

The beam-expanded fractional vortex beam sequentially passes through the second non-polarizing beam splitter, the scanning galvanometer, the scanning lens, the tube lens, the objective lens, and the sample to obtain signal return light. The signal return light is collected by the objective lens and passes through the tube lens, the scanning lens, the scanning galvanometer, and the second non-polarizing beam splitter to obtain transmitted signal return light, and the transmitted signal return light is transferred to the dark-field detection module.

Optionally, the dark-field detection module includes a diaphragm, a focusing lens, a pinhole, and a photomultiplier tube.

The transmitted signal return light sequentially passes through the diaphragm, the focusing lens, the pinhole, and the photomultiplier tube for dark-field detection to obtain a fractional-order dark-field image.

Optionally, the dark-field confocal microscopy measurement apparatus based on a differential fractional vortex beam further includes a Z-axis translation stage.

The Z-axis translation stage is configured to move the sample.

According to a second aspect, the present disclosure provides a dark-field confocal microscopy measurement method based on a differential fractional vortex beam. The dark-field confocal microscopy measurement method based on a differential fractional vortex beam is implemented based on the above dark-field confocal microscopy measurement apparatus based on a differential fractional vortex beam, and includes the followings steps:

generating first fractional vortex beam by using a fractional vortex beam module, where the first fractional-order light is generated by superposing a first vortex phase and a phase of a blazed grating;

transferring, by an optical scanning module, the first fractional vortex beam to a sample for scanning to obtain first signal return light;

performing, by a dark-field detection module, dark-field detection on the first signal return light to obtain a first fractional-order dark-field image;

generating second fractional vortex beam by using the fractional vortex beam module, where the second fractional-order light is generated by superposing a second vortex phase and the phase of the blazed grating;

transferring, by the optical scanning module, the second fractional vortex beam to the sample for scanning to obtain second signal return light;

performing, by the dark-field detection module, the dark-field detection on the second signal return light to obtain a second fractional-order dark-field image;

differentiating the first fractional-order dark-field image from the second fractional-order dark-field image to obtain a differential dark-field scattered image; and processing the differential dark-field scattered image to obtain a sample defect.

Optionally, said generating first fractional vortex beam by using a fractional vortex beam module specifically includes:

determining a first loaded phase distribution of an SLM in the fractional vortex beam module based on laser light that is in a visible light band and output by a laser; and generating the first fractional vortex beam based on the first loaded phase distribution, where the first loaded phase distribution is: $\psi_1+\Phi$ where $\psi_1=m_1\phi$, $m_1=m_0+\Delta m$, $\Phi=2\pi Gx$, $\psi_1$ is the first vortex phase, $\Phi$ is the phase of the blazed grating, $m_1$ is a first fractional order, $\phi$ is an angular polar coordinate of a liquid crystal surface of the SLM, $m_0$ is an integer, $\Delta m$ is a constant, $0<\Delta m<0.5$, G is a constant of the blazed grating, and x is a horizontal Cartesian coordinate of the liquid crystal surface of the SLM.

Optionally, said generating second fractional vortex beam by using the fractional vortex beam module specifically includes:

determining a second loaded phase distribution of an SLM in the fractional vortex beam module based on laser light that is in a visible light band and output by a laser; and generating the first fractional vortex beam based on the second loaded phase distribution, where the second loaded phase distribution is: $\psi_2+\Phi$ where $\psi_2=m_2\phi$, $m_2=m_0-\Delta m$, $\Phi=2\pi Gx$, $\psi_2$ is the second vortex phase, $\Phi$ is the phase of the blazed grating, $m_2$ is a second fractional order, $\phi$ is an angular polar coordinate of a liquid crystal surface of the SLM, $m_0$ is an integer, $\Delta m$ is a constant, $0<\Delta m<0.5$, G is a constant of the blazed grating, and x is a horizontal Cartesian coordinate of the liquid crystal surface of the SLM.

Optionally, a transfer direction of the first fractional vortex beam or the second fractional vortex beam is determined by a constant of the blazed grating.

According to specific embodiments provided in the present disclosure, the present disclosure achieves the following technical effects:

The present disclosure provides a dark-field d confocal microscopy measurement apparatus and method based on a differential fractional vortex beam. A fractional vortex beam module is used to superpose two vortex phases and a phase of a blazed grating to obtain two pieces of fractional vortex beam. Then, through an optical scanning module and a dark-field detection module, two fractional-order dark-field images can be obtained. These two fractional-order dark-field images are differentiated to obtain a differential dark-field scattered image with suppressed common-mode noise and improved sensitivity. The fractional vortex beam module is used to illuminate a sample with the fractional vortex beam. The fractional vortex beam can be equivalent to a plurality of superposed integer-order vortex components. A plurality of orders simultaneously participate in interaction between light and matter, and coherent enhancement and coherent cancellation effects are generated between signal light of various orders, which can effectively improve signal contrast of micro and nano particles. Compared with the prior art, the present disclosure can effectively separate a sample surface reflection signal and an interface defect scattering signal, and improve an imaging signal-to-noise ratio and sensitivity of defect detection based on a differential result of the two fractional-order dark-field images.

BRIEF DESCRIPTION OF DRAWINGS

To describe the technical solutions in the embodiments of the present disclosure or in the prior art more clearly, the following briefly describes the accompanying drawings required for the embodiments. Apparently, the accompanying drawings in the following description show merely some embodiments of the present disclosure, and a person of ordinary skill in the art may still derive other accompanying drawings from these accompanying drawings without creative efforts.

REFERENCE NUMERALS

1—laser; 2—half-wave plate; 3—polarizer; 4—mirror; 5—first non-polarizing beam splitter; 6—SLM; 7—beam expander; 8—second non-polarizing beam splitter; 9—scanning galvanometer; 10—scanning lens; 11—tube lens; 12—objective lens; 13—sample; 14—Z-axis translation stage; 15—diaphragm; 16—focusing lens; 17—pinhole; 18—photomultiplier tube.

DETAILED DESCRIPTION OF THE INVENTION

The technical solutions in embodiments of the present disclosure are described below clearly and completely with reference to the accompanying drawings in the embodiments of the present disclosure. Apparently, the described embodiments are merely part rather than all of the embodiments of the present disclosure. All other embodiments obtained by those of ordinary skill in the art based on the embodiments of the present disclosure without creative efforts should fall within the protection scope of the present disclosure.

To make the above objectives, features, and advantages of the present disclosure more obvious and easier to understand, the present disclosure will be further described in detail with reference to the accompanying drawings and specific implementations.

Figure 1:
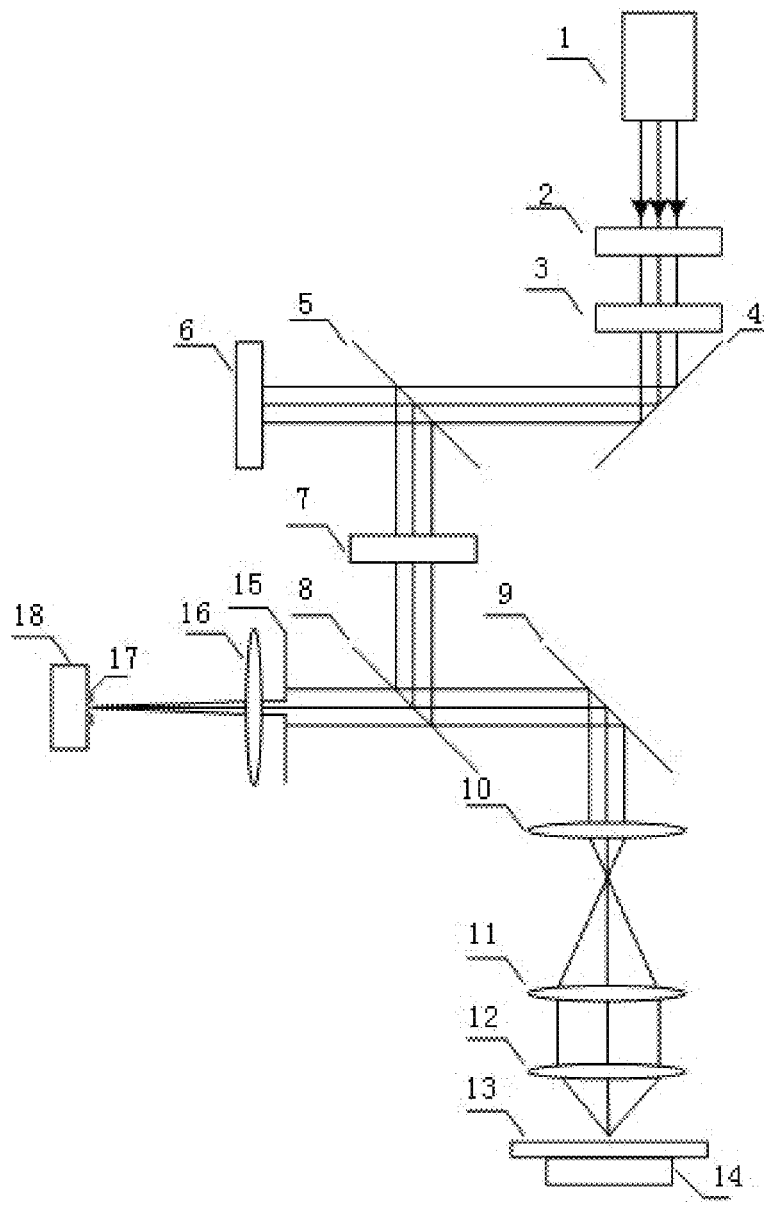
FIG. 1 is a schematic structural diagram of a dark-field confocal microscopy measurement apparatus based on a differential fractional vortex beam according to an embodiment of the present disclosure.

In an exemplary embodiment, as shown in FIG. 1, the present disclosure provides a dark-field confocal microscopy measurement apparatus based on a differential fractional vortex beam. The dark-field confocal microscopy measurement apparatus based on a differential fractional vortex beam includes a fractional vortex beam module, an optical scanning module, a dark-field detection module, a differential dark-field scattered image determining module, and a defect determining module.

The fractional vortex beam module is configured to generate first fractional vortex beam and second fractional vortex beam, where the first fractional vortex beam is generated by superposing a first vortex phase and a phase of a blazed grating, and the second fractional vortex beam is generated by superposing a second vortex phase and the phase of the blazed grating.

The optical scanning module is configured to first transfer the first fractional vortex beam to a sample 13 for scanning to obtain first signal return light, and then transfer the second fractional vortex beam to the sample 13 for scanning to obtain second signal return light.

The dark-field detection module is configured to perform dark-field detection on the first signal return light and the second signal return light to obtain a first fractional-order dark-field image and a second fractional-order dark-field image respectively.

The differential dark-field scattered image determining module is configured to differentiate the first fractional-order dark-field image from the second fractional-order dark-field image to obtain a differential dark-field scattered image.

The defect determining module is configured to process the differential dark-field scattered image to obtain a sample defect.

In an exemplary embodiment, the fractional vortex beam module includes a laser 1, a half-wave plate 2, a polarizer 3, a mirror 4, a first non-polarizing beam splitter 5, an SLM 6, and a beam expander 7.

The laser 1 is configured to output laser light in a visible light band. The laser light in the visible light band sequentially passes through the half-wave plate 2, the polarizer 3, the mirror 4, the first non-polarizing beam splitter 5, and the SLM 6 to obtain fractional vortex beam. The fractional vortex beam includes the first fractional vortex beam and the second fractional vortex beam. The fractional vortex beam is expanded by the beam expander 7 to obtain beam-expanded fractional vortex beam, and the beam-expanded fractional vortex beam is transferred to the optical scanning module.

In other words, the fractional vortex beam module includes the laser 1, the half-wave plate 2, the polarizer 3, the mirror 4, the first non-polarizing beam splitter 5, the SLM 6, and the beam expander 7 arranged sequentially in a light propagation direction.

The laser 1 is configured to emit a laser beam with a wavelength in the visible light band. The half-wave plate 2 refers to a birefringent crystal with a specific thickness. When normal incident light passes through a crystal, if a phase difference between ordinary light and extraordinary light equals π or an odd multiple of π, such a crystal is called a half-wave plate 2. The polarizer 3 refers to polaroid glass which possesses excellent optical properties such as high light transmittance. The half-wave plate 2 and the polarizer 3 are configured to adjust a polarization state of the laser light in the visible light band to match the SLM 6. The mirror 4 is configured to reflect a light beam. The first non-polarizing beam splitter 5 only separates energy of incident light, and polarization states of two outgoing light beams do not change specifically compared with a polarization state of the incident light. Therefore, the first non-polarizing beam splitter 5 only splits the light. Under active control, the SLM 6 is capable of modulating specific parameters of the optical field by means of liquid crystal molecules, for example, modulating the amplitude of the optical field, modulating the phase via the refractive index, modulating the polarization state by rotating the polarization plane, or achieving the conversion from incoherent to coherent light. Thus, specific information is inscribed into the light wave to realize light wave modulation. The SLM 6 can easily load information into one-dimensional or two-dimensional (2D) light fields and utilize the wide bandwidth and multi-channel parallel processing of light to process the loaded information quickly. The SLM 6 is a core device of real-time optical information processing, optical interconnection, optical computing, and other systems. A loaded phase distribution of the SLM 6 is the superposition of a vortex phase and the phase of the blazed grating. The beam expander 7 is configured to expand the light beam.

In an exemplary embodiment, the optical scanning module includes a second non-polarizing beam splitter 8, a scanning galvanometer 9, a scanning lens 10, a tube lens 11, and an objective lens 12.

The beam-expanded fractional vortex beam sequentially passes through the second non-polarizing beam splitter 8, the scanning galvanometer 9, the scanning lens 10, the tube lens 11, the objective lens 12, and the sample 13 to obtain signal return light.

The signal return light is collected by the objective lens 12 and passes through the tube lens 11, the scanning lens 10, the scanning galvanometer 9, and the second non-polarizing beam splitter 8 to obtain transmitted signal return light. The transmitted signal return light is transferred to the dark-field detection module.

In other words, the optical scanning module includes the second non-polarizing beam splitter 8, the scanning galvanometer 9, the scanning lens 10, the tube lens 11, the objective lens 12, and the sample 13 arranged sequentially in the light propagation direction.

The bean-expanded fractional vortex beam is reflected by the second non polarizing beam splitter 8 and enters the scanning galvanometer 9, the scanning lens 10, and the tube lens 11. After passing through the scanning lens 10 and the tube lens 11, the bean-expanded fractional vortex beam fills an entrance pupil aperture of the objective lens 12, and then is focused on the sample 13 by the objective lens 12 and scanned on the sample 13. The signal return light is collected by the objective lens 12 and passes through the tube lens 11, the scanning lens 10, and the scanning galvanometer 9 before being transmitted by the second non-polarizing beam splitter 8 to the dark-field detection module.

The second non-polarizing beam splitter 8 has a same function as the first non-polarizing beam splitter 5, and details are not described herein again. The scanning galvanometer 9 enables the laser beam to perform precise scanning on a two-dimensional plane. The scanning lens 10 is configured to focus the laser beam into a uniformly sized spot on a plane. The tube lens 11 is usually composed of an optical imaging system and an illumination system. The optical imaging system is a core part responsible for receiving the light and focusing the light onto the objective lens 12 to further amplify and image the sample. Focal lengths and magnifications of the tube lens 11 and the objective lens 12 work together to amplify and image the sample.

In an exemplary embodiment, the dark-field detection module includes a diaphragm 15, a focusing lens 16, a pinhole 17, and a photomultiplier tube 18.

The transmitted signal return light sequentially passes through the diaphragm 15, the focusing lens 16, the pinhole 17, and the photomultiplier tube 18 for dark-field detection to obtain a fractional-order dark-field image.

In other words, the dark-field detection module includes the diaphragm 15, the focusing lens 16, the pinhole 17, and the photomultiplier tube 18 sequentially arranged in the light propagation direction.

The diaphragm 15 filters out fractional-order reflected light that is approximately circular and retains central solid scattered light. The focusing lens 16 is a gradient index lens characterized by end-face focusing and imaging, and has a cylindrical shape. The pinhole 17 is a pore formed by a pair of partitions on an optical path, used to form a small point light source and filter laser beams in the optical path. The photomultiplier tube 18 is mainly configured to convert weak optical signals into electric signals. The photomultiplier tube 18 is commonly employed in optical measurement and spectral analysis instruments, capable of detecting extremely weak radiation power with wavelengths ranging from 200 nm to 1,200 nm in low level photometry and spectroscopy.

In an exemplary embodiment, the dark-field confocal microscopy measurement apparatus based on a differential fractional vortex beam further includes a Z-axis translation stage 14.

The Z-axis translation stage 14 is configured to move the sample 13.

The present disclosure uses the fractional vortex beam module to illuminate the sample with the fractional vortex beam. The fractional vortex beam can be equivalent to a plurality of superposed integer-order vortex components. A plurality of orders simultaneously participate in interaction between light and matter, and coherent enhancement and coherent cancellation effects are generated between signal light of various orders, which can effectively improve signal contrast of micro and nano particles.

Figure 2:
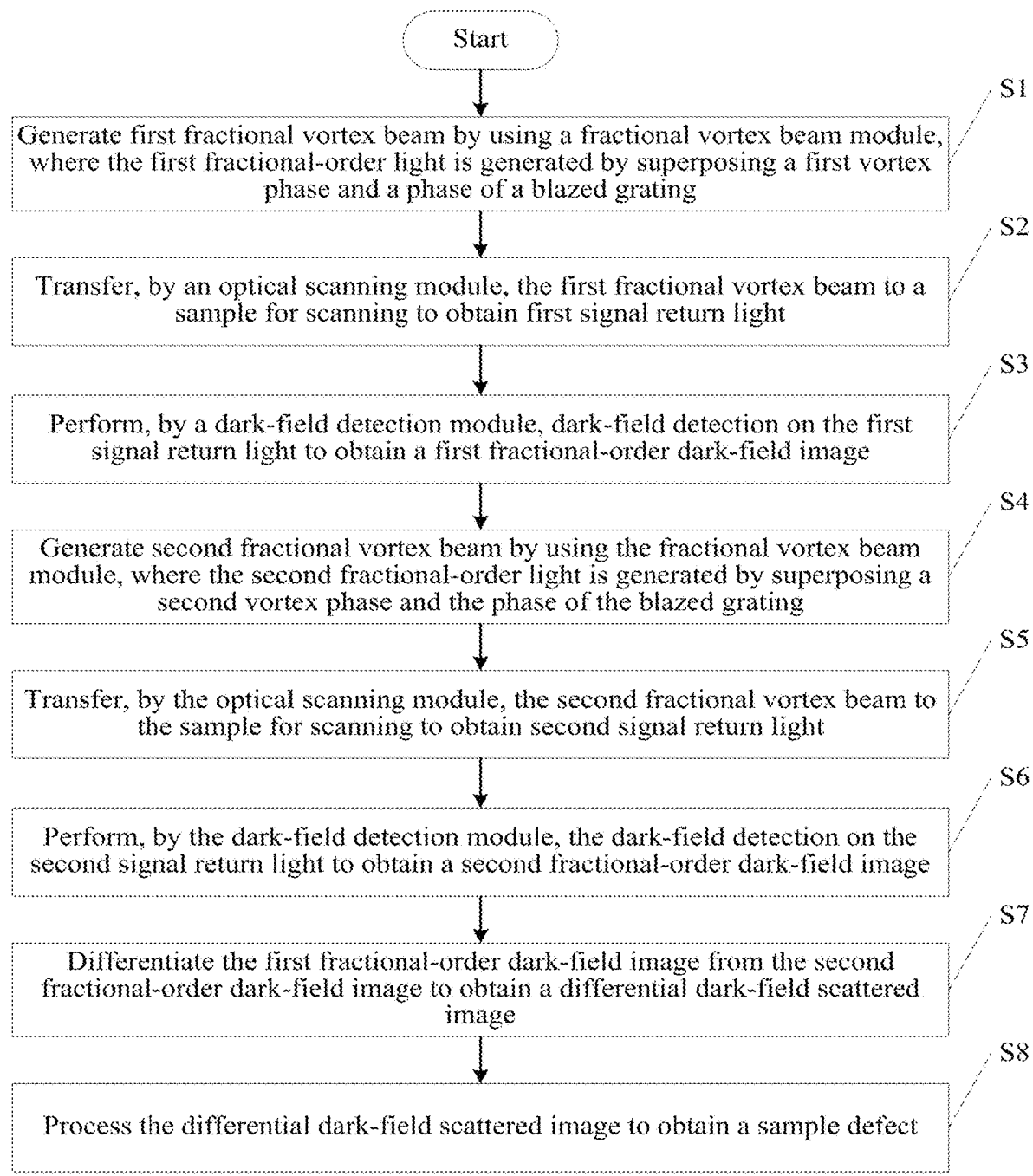
FIG. 2 is a schematic flowchart of a dark-field confocal microscopy measurement method based on a differential fractional vortex beam according to an embodiment of the present disclosure.

As shown in FIG. 2, another exemplary embodiment of the present disclosure provides a dark-field confocal microscopy measurement method based on a differential fractional vortex beam. The dark-field confocal microscopy measurement method based on a differential fractional vortex beam is implemented based on the dark-field confocal microscopy measurement apparatus based on a differential fractional vortex beam as described in the previous embodiment. The dark-field confocal microscopy measurement method based on a differential fractional vortex beam includes the following steps.

S1: Generate first fractional vortex beam by using a fractional vortex beam module, where the first fractional-order light is generated by superposing a first vortex phase and a phase of a blazed grating.

S2: Transfer, by an optical scanning module, the first fractional vortex beam to a sample for scanning to obtain first signal return light.

S3: Perform, by a dark-field detection module, dark-field detection on the first signal return light to obtain a first fractional-order dark-field image.

S4: Generate second fractional vortex beam by using the fractional vortex beam module, where the second fractional-order light is generated by superposing a second vortex phase and the phase of the blazed grating.

S5: Transfer, by the optical scanning module, the second fractional vortex beam to the sample for scanning to obtain second signal return light.

S6: Perform, by the dark-field detection module, the dark-field detection on the second signal return light to obtain a second fractional-order dark-field image.

S7: Differentiate the first fractional-order dark-field image from the second fractional-order dark-field image to obtain a differential dark-field scattered image.

S8: Process the differential dark-field scattered image to obtain a sample defect.

In an exemplary embodiment, the step S1 specifically includes the following steps:

S11: Determine a first loaded phase distribution of an SLM in the fractional vortex beam module based on laser light that is in a visible light band and output by a laser.

S12: Generate the first fractional vortex beam based on the first loaded phase distribution.

The first loaded phase distribution is: $\psi_1 + \Phi$.

As described above, $\psi_1 = m_1\phi$, $m_1 = m_0 + \Delta m$, $\Phi = 2\pi Gx$, $\psi_1$ is the first vortex phase, $\Phi$ is the phase of the blazed grating, $m_1$ is a first fractional order, $\phi$ is an angular polar coordinate of a liquid crystal surface of the SLM, $m_0$ is an integer, which is usually 1, $\Delta m$ is a constant, $0 < \Delta m < 0.5$, G is a constant of the blazed grating, and x is a horizontal Cartesian coordinate of the liquid crystal surface of the SLM.

Similarly, the step S4 specifically includes the following steps:

S41: Determine a second loaded phase distribution of the SLM in the fractional vortex beam module based on the laser light that is in the visible light band and output by the laser.

S42: Generate the first fractional vortex beam based on the second loaded phase distribution.

The second loaded phase distribution is: $\psi_2 + \Phi$.

As described above, $\psi_2 = m_2\phi$, $m_2 = m_0 - \Delta m$, $\Phi = 2\pi Gx$, $\psi_2$ is the second vortex phase, $\Phi$ is the phase of the blazed grating, $m_2$ is a second fractional order, $\phi$ is the angular polar coordinate of the liquid crystal surface of the SLM, $m_0$ is the integer, which is usually 1, $\Delta m$ is the constant, $0 < \Delta m < 0.5$, G is the constant of the blazed grating, and x is the horizontal Cartesian coordinate of the liquid crystal surface of the SLM.

It should be noted that a transfer direction of the first fractional vortex beam or the second fractional vortex beam is determined by the constant of the blazed grating. That is, the constant G of the blazed grating is used to adjust an output light beam of the SLM 6 to be coaxial with a subsequent optical path.

The present disclosure can effectively separate a surface reflection signal of the sample from an interface defect scattering signal, and improve an imaging signal-to-noise ratio and sensitivity of defect detection based on a differential result of the two fractional-order dark-field images.

As a possible implementation, a dark-field confocal microscopy measurement apparatus based on a differential fractional vortex beam includes the following steps:

Step a: A laser 1 outputs laser light in a visible light band, and a half-wave plate 2 and a polarizer 3 adjust a polarization state of the laser light in the visible light band to match an SLM 6. The laser light in the visible light band is then reflected by a mirror 4 to a first non-polarizing beam splitter 5 and split by the first non-polarizing beam splitter 5 before entering the SLM 6.

Step b: A first loaded phase distribution of the SLM 6 is $\psi_{14}+\Phi$, where $\psi_1=m_1\phi$, $m_1=m_0+\Delta m$, $\Phi=2\pi Gx$, $\psi_1$ is a first vortex phase, $\Phi$ is a phase of a blazed grating, $m_1$ is a first fractional order, $\phi$ is an angular polar coordinate of a liquid crystal surface of the SLM, $m_0$ is an integer, which is usually 1, $\Delta m$ is a constant, $0<\Delta m<0.5$, G is a constant of the blazed grating, which is used to adjust an output light beam of the SLM 6 to be coaxial with a subsequent optical path, and x is a horizontal Cartesian coordinate of the liquid crystal surface of the SLM. First fractional vortex beam is generated based on the first loaded phase distribution.

Step c: After being expanded by a beam expander 7, the first fractional vortex beam is reflected by a second non-polarizing beam splitter 8 to a scanning galvanometer 9, reflected by the scanning galvanometer 9 to a scanning lens 10, and then focused on a sample 13 through a tube lens 11 and an objective lens 12 and scanned on the sample 13 to obtain first signal return light.

Step d: After being collected by the objective lens 12, the first signal return light passes through the tube lens 11, the scanning lens 10, the scanning galvanometer 9, and the second non-polarizing beam splitter 8, and then is transmitted to a diaphragm 15 through the second non-polarizing beam splitter 8. The diaphragm 15 filters out fractional-order reflected light that is approximately circular and retains central solid scattered light. A focusing lens 16, a pinhole 17, and a photomultiplier tube 18 perform dark-field detection to obtain an $m_0+\Delta m$-order dark-field image.

Step e: A second loaded phase distribution of the SLM 6 is: $\psi_2+\Phi$, where $\psi_2=m_2\phi$, $m_2=m_0-\Delta m$, $\Phi=2\pi Gx$, $\psi_1$ is a second vortex phase, $\Phi$ is the phase of, the blazed grating, $m_2$ is a second fractional order, $\phi$ is the angular polar coordinate of the liquid crystal surface of the SLM, $m_0$ is the integer, which is usually 1, $\Delta m$ is the constant, $0<\Delta m<0.5$, G is the constant of the blazed grating, and x is the horizontal Cartesian coordinate of the liquid crystal surface of the SLM. Second fractional vortex beam is generated based on the second loaded phase distribution.

Step f: After being expanded by the beam expander 7, the second fractional vortex beam is reflected by the second non-polarizing beam splitter 8 to the scanning galvanometer 9, reflected by the scanning galvanometer 9 to the scanning lens 10, and then focused on the sample 13 through the tube lens 11 and the objective lens 12 and scanned on the sample 13 to obtain second signal return light.

Step g: After being collected by the objective lens 12, the second signal return light passes through the tube lens 11, the scanning lens 10, the scanning galvanometer 9, and the second non-polarizing beam splitter 8, and then is transmitted to the diaphragm 15 through the second non-polarizing beam splitter 8. The diaphragm 15 filters out fractional-order reflected light that is approximately circular and retains central solid scattered light. The focusing lens 16, the pinhole 17, and the photomultiplier tube 18 perform dark-field detection to obtain an $m_0-\Delta m$-order dark-field image.

Step h: Differentiate the $m_0+\Delta m$-order dark-field image from the $m_0-\Delta m$-order dark-field image to obtain a differential dark-field scattered image with suppressed common-mode noise and improved sensitivity.

Step i: Process the differential dark-field scattered image to obtain a sample defect.

The present disclosure further provides an application scenario to which the above dark-field confocal microscopy measurement method based on a differential fractional vortex beam is applied. Specifically, the dark-field confocal microscopy measurement method based on a differential fractional vortex beam provided in the embodiments can be applied to a dark-field confocal microscopy measurement scenario. The dark-field confocal microscopy measurement scenario includes a fractional vortex beam generation stage, an optical scanning stage, and a dark-field detection stage. Different fractional vortex beam is generated by using a fractional vortex beam module. Then, in the optical scanning stage, a sample is scanned by using the different fractional vortex beam, to obtain different signal return light. After that, in the dark-field detection stage, different fractional-order dark-field images are obtained. The different fractional-order dark-field images are differentiated to obtain a differential dark-field scattered image. The differential dark-field scattered image is processed to obtain a defect of the sample.

The technical characteristics of the above embodiments can be employed in arbitrary combinations. To provide a concise description of these embodiments, all possible combinations of all the technical characteristics of the above embodiments may not be described; however, these combinations of the technical characteristics should be construed as falling within the scope defined by the specification as long as no contradiction occurs.

Several examples are used herein for illustration of the principles and implementations of the present disclosure. The description of the foregoing embodiments is only used to help illustrate the method of the present disclosure and the core principles thereof. In addition, those of ordinary skill in the art can make various modifications in terms of specific implementations and scope of application in accordance with the teachings of the present disclosure. In conclusion, the content of the present specification shall not be construed as a limitation to the present disclosure.

The invention claimed is:

1. A dark-field confocal microscopy measurement apparatus based on a differential fractional vortex beam, comprising a fractional vortex beam module, an optical scanning module, a dark-field detection module, a differential dark-field scattered image determining module, and a defect determining module, wherein the fractional vortex beam module is configured to generate first fractional vortex beam and second fractional vortex beam, wherein the first fractional vortex beam is generated by superposing a first vortex phase and a phase of a blazed grating, and the second fractional vortex beam is generated by superposing a second vortex phase and the phase of the blazed grating;

the optical scanning module is configured to first transfer the first fractional vortex beam to a sample for scanning to obtain first signal return light, and then transfer the second fractional vortex beam to the sample for scanning to obtain second signal return light;

the dark-field detection module is configured to perform dark-field detection on the first signal return light and the second signal return light to obtain a first fractional-order dark-field image and a second fractional-order dark-field image respectively;

the differential dark-field scattered image determining module is configured to differentiate the first fractional-order dark-field image from the second fractional-order dark-field image to obtain a differential dark-field scattered image; and the defect determining module is configured to process the differential dark-field scattered image to obtain a sample defect.

2. The dark-field confocal microscopy measurement apparatus based on a differential fractional vortex beam according to claim 1, wherein the fractional vortex beam module comprises a laser, a half-wave plate, a polarizer, a mirror, a first non-polarizing beam splitter, a spatial light modulator (SLM), and a beam expander; and the laser is configured to output laser light in a visible light band, wherein the laser light in the visible light band sequentially passes through the half-wave plate, the polarizer, the mirror, the first non-polarizing beam splitter, and the SLM to obtain fractional vortex beam, the fractional vortex beam comprises the first fractional vortex beam and the second fractional vortex beam, the fractional vortex beam is expanded by the beam expander to obtain beam-expanded fractional vortex beam, and the beam-expanded fractional vortex beam is transferred to the optical scanning module.

3. The dark-field confocal microscopy measurement apparatus based on a differential fractional vortex beam according to claim 2, wherein a loaded phase distribution of the SLM is the superposition of a vortex phase and the phase of the blazed grating.

4. The dark-field confocal microscopy measurement apparatus based on a differential fractional vortex beam according to claim 2, wherein the optical scanning module comprises a second non-polarizing beam splitter, a scanning galvanometer, a scanning lens, a tube lens, and an objective lens;

the beam-expanded fractional vortex beam sequentially passes through the second non-polarizing beam splitter, the scanning galvanometer, the scanning lens, the tube lens, the objective lens, and the sample to obtain signal return light; and the signal return light is collected by the objective lens and passes through the tube lens, the scanning lens, the scanning galvanometer, and the second non-polarizing beam splitter to obtain transmitted signal return light, and the transmitted signal return light is transferred to the dark-field detection module.

5. The dark-field confocal microscopy measurement apparatus based on a differential fractional vortex beam according to claim 4, wherein the dark-field detection module comprises a diaphragm, a focusing lens, a pinhole, and a photomultiplier tube; and the transmitted signal return light sequentially passes through the diaphragm, the focusing lens, the pinhole, and the photomultiplier tube for dark-field detection to obtain a fractional-order dark-field image.

6. The dark-field confocal microscopy measurement apparatus based on a differential fractional vortex beam according to claim 1, wherein the dark-field confocal microscopy measurement apparatus based on a differential fractional vortex beam further comprises a Z-axis translation stage; and the Z-axis translation stage is configured to move the sample.

7. A dark-field confocal microscopy measurement method based on a differential fractional vortex beam, wherein the dark-field confocal microscopy measurement method based on a differential fractional vortex beam is implemented based on the dark-field confocal microscopy measurement apparatus based on a differential fractional vortex beam according to claim 1, and comprises:

generating first fractional vortex beam by using a fractional vortex beam module, wherein the first fractional-order light is generated by superposing a first vortex phase and a phase of a blazed grating;

transferring, by an optical scanning module, the first fractional vortex beam to a sample for scanning to obtain first signal return light;

performing, by a dark-field detection module, dark-field detection on the first signal return light to obtain a first fractional-order dark-field image;

generating second fractional vortex beam by using the fractional vortex beam module, wherein the second fractional-order light is generated by superposing a second vortex phase and the phase of the blazed grating;

transferring, by the optical scanning module, the second fractional vortex beam to the sample for scanning to obtain second signal return light;

performing, by the dark-field detection module, the dark-field detection on the second signal return light to obtain a second fractional-order dark-field image;

differentiating the first fractional-order dark-field image from the second fractional-order dark-field image to obtain a differential dark-field scattered image; and processing the differential dark-field scattered image to obtain a sample defect.

8. The dark-field confocal microscopy measurement method based on a differential fractional vortex beam according to claim 7, wherein said generating first fractional vortex beam by using a fractional vortex beam module specifically comprises:

determining a first loaded phase distribution of an SLM in the fractional vortex beam module based on laser light that is in a visible light band and output by a laser; and generating the first fractional vortex beam based on the first loaded phase distribution, wherein the first loaded phase distribution is: $\psi_1 + \Phi$ wherein $\psi_1 = m_1 \phi$, $m_1 = m_0 + \Delta m$, $\Phi = 2\pi Gx$, $\psi_1$ is the first vortex phase, $\Phi$ is the phase of the blazed grating, $m_1$ is a first fractional order, $\phi$ is an angular polar coordinate of a liquid crystal surface of the SLM, $m_0$ is an integer, $\Delta m$ is a constant, $0 < \Delta m < 0.5$, G is a constant of the blazed grating, and x is a horizontal Cartesian coordinate of the liquid crystal surface of the SLM.

9. The dark-field confocal microscopy measurement method based on a differential fractional vortex beam according to claim 7, wherein said generating second fractional vortex beam by using the fractional vortex beam module specifically comprises:

determining a second loaded phase distribution of an SLM in the fractional vortex beam module based on laser light that is in a visible light band and output by a laser; and generating the first fractional vortex beam based on the second loaded phase distribution, wherein the second loaded phase distribution is: $\psi_2 + \Phi$ $\psi_2 = m_2 \phi$, $m_2 = m_0 - \Delta m$, $\Phi = 2\pi Gx$, $\psi_2$ is the second vortex phase, wherein $\Phi$ is the phase of the blazed grating, $m_2$ is a second fractional order, $\phi$ is an angular polar coordinate of a liquid crystal surface of the SLM, $m_0$ is an integer, $\Delta m$ is a constant, $0 < \Delta m < 0.5$, G is a constant of the blazed grating, and x is a horizontal Cartesian coordinate of the liquid crystal surface of the SLM.

10. The dark-field confocal microscopy measurement method based on a differential fractional vortex beam according to claim 7, wherein a transfer direction of the first fractional vortex beam or the second fractional vortex beam is determined by a constant of the blazed grating.

11. The dark-field confocal microscopy measurement method based on a differential fractional vortex beam according to claim 7, wherein the fractional vortex beam module comprises a laser, a half-wave plate, a polarizer, a mirror, a first non-polarizing beam splitter, a spatial light modulator (SLM), and a beam expander; and the laser is configured to output laser light in a visible light band, wherein the laser light in the visible light band sequentially passes through the half-wave plate, the polarizer, the mirror, the first non-polarizing beam splitter, and the SLM to obtain fractional vortex beam, the fractional vortex beam comprises the first fractional vortex beam and the second fractional vortex beam, the fractional vortex beam is expanded by the beam expander to obtain beam-expanded fractional vortex beam, and the beam-expanded fractional vortex beam is transferred to the optical scanning module.

12. The dark-field confocal microscopy measurement method based on a differential fractional vortex beam according to claim 11, wherein a loaded phase distribution of the SLM is the superposition of a vortex phase and the phase of the blazed grating.

13. The dark-field confocal microscopy measurement method based on a differential fractional vortex beam according to claim 11, wherein the optical scanning module comprises a second non-polarizing beam splitter, a scanning galvanometer, a scanning lens, a tube lens, and an objective lens;

the beam-expanded fractional vortex beam sequentially passes through the second non-polarizing beam splitter, the scanning galvanometer, the scanning lens, the tube lens, the objective lens, and the sample to obtain signal return light; and the signal return light is collected by the objective lens and passes through the tube lens, the scanning lens, the scanning galvanometer, and the second non-polarizing beam splitter to obtain transmitted signal return light, and the transmitted signal return light is transferred to the dark-field detection module.

14. The dark-field confocal microscopy measurement method based on a differential fractional vortex beam according to claim 13, wherein the dark-field detection module comprises a diaphragm, a focusing lens, a pinhole, and a photomultiplier tube; and the transmitted signal return light sequentially passes through the diaphragm, the focusing lens, the pinhole, and the photomultiplier tube for dark-field detection to obtain a fractional-order dark-field image.

15. The dark-field confocal microscopy measurement method based on a differential fractional vortex beam according to claim 7, wherein the dark-field confocal microscopy measurement apparatus based on a differential fractional vortex beam further comprises a Z-axis translation stage; and the Z-axis translation stage is configured to move the sample.

16. The dark-field confocal microscopy measurement method based on a differential fractional vortex beam according to claim 11, wherein said generating first fractional vortex beam by using a fractional vortex beam module specifically comprises:

determining a first loaded phase distribution of an SLM in the fractional vortex beam module based on laser light that is in a visible light band and output by a laser; and generating the first fractional vortex beam based on the first loaded phase distribution, wherein the first loaded phase distribution is: $\psi_1 + \Phi$ wherein $\psi_1 = m_1 \phi$, $m_1 = m_0 + \Delta m$, $\Phi = 2\pi Gx$, $\psi_1$ is the first vortex phase, $\Phi$ is the phase of the blazed grating, $m_1$ is a first fractional order, $\phi$ is an angular polar coordinate of a liquid crystal surface of the SLM, $m_0$ is an integer, $\Delta m$ is a constant, $0 < \Delta m < 0.5$, G is a constant of the blazed grating, and x is a horizontal Cartesian coordinate of the liquid crystal surface of the SLM.

17. The dark-field confocal microscopy measurement method based on a differential fractional vortex beam according to claim 13, wherein said generating first fractional vortex beam by using a fractional vortex beam module specifically comprises:

determining a first loaded phase distribution of an SLM in the fractional vortex beam module based on laser light that is in a visible light band and output by a laser; and generating the first fractional vortex beam based on the first loaded phase distribution, wherein the first loaded phase distribution is: $\psi_1 + \Phi$ wherein $\psi_1 = m_1 \phi$, $m_1 = m_0 + \Delta m$, $\Phi = 2\pi Gx$, $\psi_1$ is the first vortex phase, $\Phi$ is the phase of the blazed grating, $m_1$ is a first fractional order, $\phi$ is an angular polar coordinate of a liquid crystal surface of the SLM, $m_0$ is an integer, $\Delta m$ is a constant, $0 < \Delta m < 0.5$, G is a constant of the blazed grating, and x is a horizontal Cartesian coordinate of the liquid crystal surface of the SLM.

18. The dark-field confocal microscopy measurement method based on a differential fractional vortex beam according to claim 13, wherein said generating first fractional vortex beam by using a fractional vortex beam module specifically comprises:

determining a first loaded phase distribution of an SLM in the fractional vortex beam module based on laser light that is in a visible light band and output by a laser; and generating the first fractional vortex beam based on the first loaded phase distribution, wherein the first loaded phase distribution is: $\psi_1 + \Phi$ wherein $\psi_1 = m_1 \phi$, $m_1 = m_0 + \Delta m$, $\Phi = 2\pi Gx$, $\psi_1$ is the first vortex phase, $\Phi$ is the phase of the blazed grating, $m_1$ is a first fractional order, $\phi$ is an angular polar coordinate of a liquid crystal surface of the SLM, $m_0$ is an integer, $\Delta m$ is a constant, $0 < \Delta m < 0.5$, G is a constant of the blazed grating, and x is a horizontal Cartesian coordinate of the liquid crystal surface of the SLM.

19. The dark-field confocal microscopy measurement method based on a differential fractional vortex beam according to claim 14, wherein said generating first fractional vortex beam by using a fractional vortex beam module specifically comprises:

determining a first loaded phase distribution of an SLM in the fractional vortex beam module based on laser light that is in a visible light band and output by a laser; and generating the first fractional vortex beam based on the first loaded phase distribution, wherein the first loaded phase distribution is: $\psi_1 + \Phi$ wherein $\psi_1 = m_1 \phi$, $m_1 = m_0 + \Delta m$, $\Phi = 2\pi Gx$, $\psi_1$ is the first vortex phase, $\Phi$ is the phase of the blazed grating, $m_1$ is a first fractional order, $\phi$ is an angular polar coordinate of a liquid crystal surface of the SLM, $m_0$ is an integer, $\Delta m$ is a constant, $0 < \Delta m < 0.5$, G is a constant of the blazed grating, and x is a horizontal Cartesian coordinate of the liquid crystal surface of the SLM.

20. The dark-field confocal microscopy measurement method based on a differential fractional vortex beam according to claim 15, wherein said generating first fractional vortex beam by using a fractional vortex beam module specifically comprises:

determining a first loaded phase distribution of an SLM in the fractional vortex beam module based on laser light that is in a visible light band and output by a laser; and generating the first fractional vortex beam based on the first loaded phase distribution, wherein the first loaded phase distribution is: $\psi_1 + \Phi$ wherein $\psi_1 = m_1 \phi$, $m_1 = m_0 + \Delta m$, $\Phi = 2\pi G x$, $\psi_1$ is the first vortex phase, $\Phi$ is the phase of the blazed grating, $m_1$ is a first fractional order, $\phi$ is an angular polar coordinate of a liquid crystal surface of the SLM, $m_0$ is an integer, $\Delta m$ is a constant, $0 < \Delta m < 0.5$, G is a constant of the blazed grating, and x is a horizontal Cartesian coordinate of the liquid crystal surface of the SLM.

* * * * *